United States Patent [19]

Tsukamoto et al.

[11] 4,203,082
[45] May 13, 1980

[54] SURFACE ACOUSTIC WAVE FILTER

[75] Inventors: Masahide Tsukamoto, Neyagawa; Masahiro Nagasawa, Hirakata; Hiroshi Yamazoe, Katano, all of Japan

[73] Assignee: Matsushita Electric Industrial Co., Ltd., Osaka, Japan

[21] Appl. No.: 911,082

[22] Filed: May 31, 1978

[30] Foreign Application Priority Data

Jun. 3, 1977 [JP] Japan ................................. 52/66141

[51] Int. Cl.² ........................ H03H 9/04; H03H 9/26; H03H 9/32; H01L 41/10
[52] U.S. Cl. .................................. 333/194; 310/313; 333/196
[58] Field of Search ......... 333/30 R, 72, 71, 150–155, 333/193–196; 310/313; 330/5.5; 331/107 A

[56] References Cited
U.S. PATENT DOCUMENTS 4,016,513  4/1977  Solie .................................. 333/30 R
4,028,649  6/1977  Komatsu et al. ...................... 333/194

OTHER PUBLICATIONS

Wauk–"Suppression of Spurious Triple-Transit Signals in Acoustic Surface-Wave Delay Lines", in Appl. Phys. Lett., vol. 20, No. 12, Jun. 15, 1972; pp. 481–483.

Primary Examiner—Alfred E. Smith
Assistant Examiner—Marvin Nussbaum
Attorney, Agent, or Firm—Wenderoth, Lind & Ponack

[57] ABSTRACT

To obtain low insertion loss and low TTE level, a first central transducer, a second transducer and a third transducer are disposed on one surface of a piezoelectric substrate in such a manner that the second and the third transducers are in the direction of propagation (X-direction) of surface acoustic waves launched by the first transducer and the distance between center lines of the first and the second transducers and also the distance between the center lines of the first and the third transducers vary along the Y-direction perpendicular to the X-direction.

27 Claims, 27 Drawing Figures

FIG. 16"

SURFACE ACOUSTIC WAVE FILTER

BACKGROUND OF THE INVENTION

This invention relates to a surface acoustic wave filter.

Surface acoustic waves are effectively excited by an interdigital transducer constructed on a surface of a piezoelectric substrate within frequency range determined by the structure of the interdigital transducer and surface acoustic velocity of the piezoelectric substrate. SAW (surface acoustic wave) filters were proposed utilizing the properties in which a first transducer converts an input electrical signal to a surface acoustic wave with frequency characteristics determined by the structure of the transducer, and a second transducer receives the acoustic wave to convert the surface acoustic wave to an output electrical signal with frequency characteristics determined by the structure of the transducer. Filters for many objects, for example a video-interfrequency-filter (VIF) of a television set, are expected.

However, the fact is that SAW filters are not widely used because it is difficult to obtain low insertion loss without ripple within pass band by using SAW filters. The ripple of the amplitude of a transferred signal and also the ripple of group delay are caused by multi-reflection of the surface acoustic wave between the input and the output transducers. Twice-reflected waves are largest among the multi-reflected waves. This wave is called "Triple Transit Echo" or "TTE". That is, surface acoustic wave launched by the input transducer propagates toward the output transducer and the incident wave to the output transducer is reflected backward and propagates toward the input transducer, and further the wave is again reflected by the input transducer toward the output transducer. The twice-reflected acoustic wave (triple transit wave) delays by $2\tau$ in time when measured with the main wave (once-transit wave) where $\tau$ is a time for the acoustic wave to propagate from the input transducer to the output transducer and this causes ripple in amplitude and group delay response by the interaction of the twice-reflected wave and the main wave.

In common SAW filters, it is known that the level of the TTE is expressed approximately by an equation:

$$\text{TTE(dB)} \approx -(2 \times \text{Insertion loss} + 6)(\text{dB}).$$

For example, the level of TTE becomes $-26$ dB if the limit of the insertion loss for practical usage is determined to be 10 dB. The level $-26$ dB is not acceptable. For practical usage, about $-40$ dB or less than that is required. Such high level of the TTE as mentioned above causes a ghost or picture color distortion such that the desired color is not reproduced, and further the picture is blurred or becomes conversely an enhanced sharp picture.

There are two reasons for the multi-reflection in SAW filters as described above. One is discontinuity of acoustic impedance caused by the metal deposited on piezoelectric substrate to make input and output transducers. The other reason is regeneration of an acoustic surface wave by the output transducer, in which the transducer receives the incident wave launched by the input transducer and also acts as a transmitter. Then amplitude and phase of the regenerated wave depend on the load connected to the output transducer. Such regeneration of the acoustic wave also occurs in the input transducer. Then, multi-reflection occurs. Multi-reflection caused by the latter reason is difficult to remove. It is known that multi-reflection caused by the former reason can be easily removed by using split electrodes in which each electrode (or finger) of the interdigital transducer has a width of one eighth of the wavelength of the surface acoustic wave at a frequency at which the transducer has maximum response and also has spaces of one eighth of such wavelength. However, the multi-reflection caused by the latter reason is difficult to remove.

Some methods to remove the multi-reflection caused by the latter reason have been proposed. One example is a method to use extra reflection transducers other than input and output transducers, in which the reflection transducers are placed apart from the input or output transducer by one fourth of such wavelength, and the waves reflected by the reflection transducers interact with the wave reflected by the input ot output transducer to eliminate the wave reflected by the input or output transducer. Another example is a method to use an input transducer which is driven by two or three drivers (sources) with phases different from each other by 120°, and to obtain a surface acoustic wave propagating in one direction, and further to use an output transducer which is similar to the input transducer and which acts as an inverse converter for converting acoustic waves to electrical signals. However, these methods for eliminating the TTE have disadvantages. For the former case, a large piezoelectric substrate is required to deposit the reflection transducer. For the latter case, the structure of the input and output transducers become complex to require drivers (sources) with two or three different phases and also circuits to inversely convert the signals.

SUMMARY OF THE INVENTION

It is an object of this invention to provide a surface acoustic wave filter which can attain both low insertion loss and low TTE level by a simple structure of the input and output transducers.

This object is achieved according to this invention by providing a surface acoustic wave filter with a three-transducer configuration of a piezoelectric substrate in which a first transducer connected to a signal source launches surface acoustic waves, and second and third transducers connected in series or in parallel to a load to convert the launched surface acoustic waves to electrical signals, characterized in that the second and third transducers are arranged in such a manner that the distance between central lines of the first and second transducers and the distance between central lines of the first and third transducers vary linearly along the Y-direction which is perpendicular to the X-direction which is parallel to the direction of the surface acoustic waves, under the condition $|l_{1t} - l_{1b}| = |l_{2t} - l_{2b}| = \alpha \lambda_0$ where $l_{1t}$ and $l_{1b}$ are distances between the center lines of the first and the second transducers at the top part and the bottom part of the first and second transducers, respectively, $l_{2t}$ and $l_{2b}$ are distances between the center lines of the first and the third transducers at the top part and the bottom part of the first and the third transducers, respectively, $\alpha$ is a coefficient between 0.15 and 0.45, and $\lambda_0$ is a wavelength of a surface acoustic wave at a center frequency at which the first transducer has a maximum response.

BRIEF DESCRIPTION OF THE DRAWINGS

The features of this invention will be apparent from the following detailed description taken in conjunction with the accompanying drawings, in which:

FIG. 1' is a schematic drawing as of FIG. 1, in which each finger of the transducer is of the split-electrode type;

FIG. 16' is a drawing showing the relation of the distances between each of the segmental transducers of the first, the second and the third transducers in the case of two segmental transducers;

FIG. 16" is a drawing showing the relation of the distances between each of the segmental transducers of the first, the second and the third transducers in the case of three segmental transducers;

DETAILED DESCRIPTION OF THE INVENTION

Figure 1:
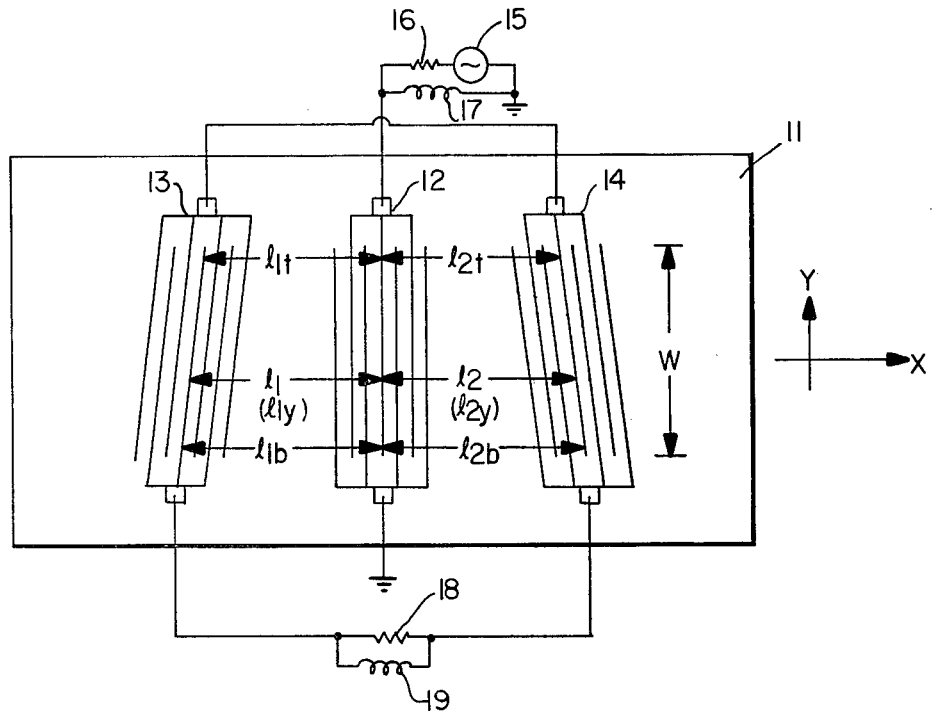
FIG. 1 is a schematic plan view of one embodiment of a surface acoustic filter of the present invention and its electrical connection.
Figure 1:
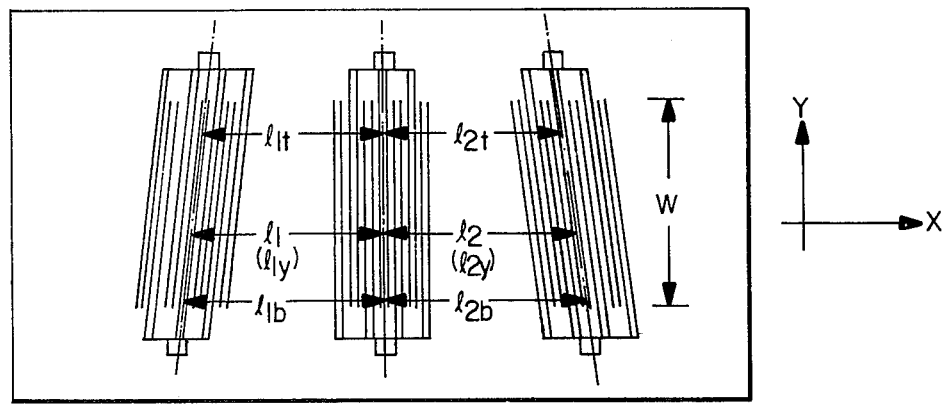

Referring to FIG. 1, a signal source 15 in series with a resistor 16 which is an internal impedance of the signal source is connected to an input transducer 12 which launches surface acoustic waves on a surface of a piezoelectric substrate 11. A second transducer 13 and a third transducer 14 are placed on both sides of the first transducer 12. The second and the third transducers 13, 14 are connected in series through a resistor 18 for output load. Inductors 17, 19 are connected in parallel to source 15 and load resistor 16, 18 for tuning. Each of the first, the second and the third transducers consist of two comb-type electrode arrays which are electrically conductive. Each transducer is usually called an interdigital transducer. The piezoelectric substrate may be piezoelectric crystals such as $LiNbO_3$, $LiTaO_3$, $Bi_{12}GeO_{20}$, $SiO_2$ etc., or piezoelectric ceramics such as PZT, or piezoelectric thin films such as ZnO on glass. $l_1$ and $l_2$ are distances between the center lines of the first and the second transducers 12, 13 and the center lines of the first and the third transducers 12, 14, respectively. When the number of fingers of the comb-type electrode array is odd, the center line exists at the center of central finger of the transducer, but when the number of the fingers is even, the center line exist at the center of the space between the central two fingers of the transducer. $l_{1t}$ and $l_{2t}$ are distances $l_1$ and $l_2$ at the top parts of the overlapped region (width W) of the upper comb and the lower comb. And also $l_{1b}$ and $l_{2b}$ are distances $l_1$ and $l_2$ at the bottom parts of the overlapped region (W). As shown in FIG. 1, $l_1$ and $l_2$ vary with the change of position in the Y-direction which is perpendicular to the X-direction in which a surface acoustic wave launched by the first transducer 12 propagates.

The first transducer 12 launches two surface acoustic waves, one of which propagates in the direction of the second transducer 13 and the other of which propagates in the direction of the third transducer. The respective waves are partially reflected by the second and the third transducers and partially pass through the second and the third transducers, and the residual waves (non-reflected waves) are converted to electrical signals to appear as output signals across the output load 18. The waves reflected by the second and the third transducers are partially reflected by the first transducer and partially pass through the first transducer and propagate toward the third and the second transducers. In such a way, the first, the second and the third transducers highly interact.

In FIG. 1 of the present invention, the distances $l_{1t}$ and $l_{2t}$ are different from $l_{1b}$ and $l_{2b}$, respectively, to suppress the ripple in amplitude and group delay responses. The difference between the distances $l_{1t}$ and $l_{1b}$ and between $l_{2t}$ and $l_{2b}$ satisfies an equation $$|l_{1t} - l_{1b}| = |l_{2t} = l_{2b}| = \alpha\lambda_0 \quad (1)$$

where $\lambda_0$ is the wavelength of an acoustic wave at center frequency $f_0$ at which the first transducer has maximum response and $\alpha$ is 0.15 to 0.45, preferablly 0.3. For a conventional case, $\alpha$ is 0 (i.e., conventional three transducer configuration). As described before the wave reflection results from two causes. One is discontinuity of acoustic impedance due to the mass of the deposited metal (electrode), and the other is regeneration of the acoustic wave by the transducers which depends on the electrical impedances of the source and load. The former cause can be easily removed by using a known split-electrode configuration as shown in FIG. 1'. (When the piezoelectric material has a very low coupling constant, the discontinuity of acoustic impedance is neglibly small.) The present invention removes the latter cause. In the examples described herein as to both the filters of the present invention and the conventional filters, the split-electrode configuration is used because the piezoelectric substrate used herein has a large coupling constant. If a piezoelectric substrate of a very low coupling constant such as zinc oxide and $SiO_2$ is used, it is unnecessary to use the split-electrode configuration.

As is apparent from FIG. 1', in the case of the split-electrode configuration, the center of the gap between the split electrode finger corresponds to the center of the non-split electrode finger for defining the distances between electrodes.

Figure 2:
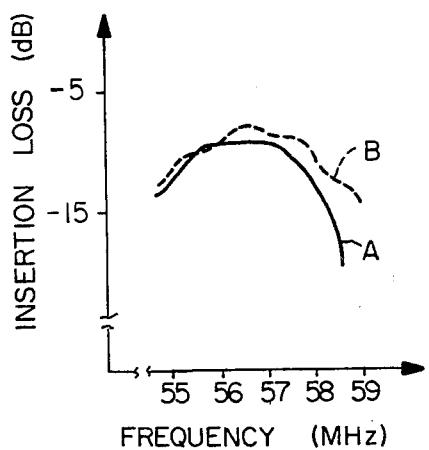
FIG. 2 is a graph of amplitude responses of the surface acoustic wave filter of FIG. 1 and of a conventional surface acoustic wave filter.

FIG. 2 shows the amplitude responses of a conventional filter with a three-transducer configuration and a filter of the present invention such as shown in FIG. 1. In the measurements, numbers of fingers (or electrodes) of each transducer are identical and they are 32 in the case of FIG. 2. The resistors 16, 18 of the source and the output load are 50 Ω. The inductors 17, 19 for tuning connected in parallel to the source and load resistors are 0.2 μH and 0.44 μH, respectively. The used piezoelectric substrate is a ceramics of a solid solution of lead titanate-lead zirconate-lead magnesium niobate having an effective coupling constant of 0.2, and a surface acoustic wave velocity of 2330.5 msec. The capacitance between two adjacent electrode fingers is 4.9 pF/mm. Geometrical configuration is as follows. (curve A in FIG. 2) (FIG. 2A):

$W = 0.6$ mm, $l_{1t} = l_{2t} = 26.0\ \lambda_0$, $l_{1b} = l_{2b} = 26.3\ \lambda_0$ (i.e. $\alpha = 0.3$) and $l_1$ and $l_2$ are varied linearly between $26.0\ \lambda_0$ and $26.3\ \lambda_0$ where $\lambda_0$ is the wavelength of the surface acoustic wave at center frequency $f_0$ at which the transducers have maximum response and given by an equation $\lambda_0 = v/f_0 = 2d$, v being the velocity of the surface acoustic wave, and d being the distance between the centers of adjacent fingers measured in the X-direction.

In the case of the conventional three-transducer configuration:

$W = 0.3$ mm $l_{1t} = l_{2t} = l_{1b} = l_{2b} = 26.0\ \lambda_0$ (i.e. $\alpha = 0$).

In FIG. 2, Curve A drawn by the solid line is the amplitude response of the filter of the present invention and Curve B drawn by the broken line is that of the conventional filter with three-transducer configuration. In the above example, $\alpha$ was varied. The results are shown in table 1. Table 1 shows the relation between $\alpha$ and insertion loss and ripple in group delay.

Table 1

| $\alpha$ | Insertion loss (dB) | Ripple in group delay (nsec) |
| --- | --- | --- |
| 0 | 7.5 | 150 |
| 0.1 | 7.5 | 125 |
| 0.15 | 7.7 | 110 |
| 0.20 | 8.0 | 90 |
| 0.30 | 9.0 | 70 |
| 0.40 | 9.5 | 70 |
| 0.45 | 10.5 | 90 |
| 0.50 | 12.0 | 100 |

Figure 9:
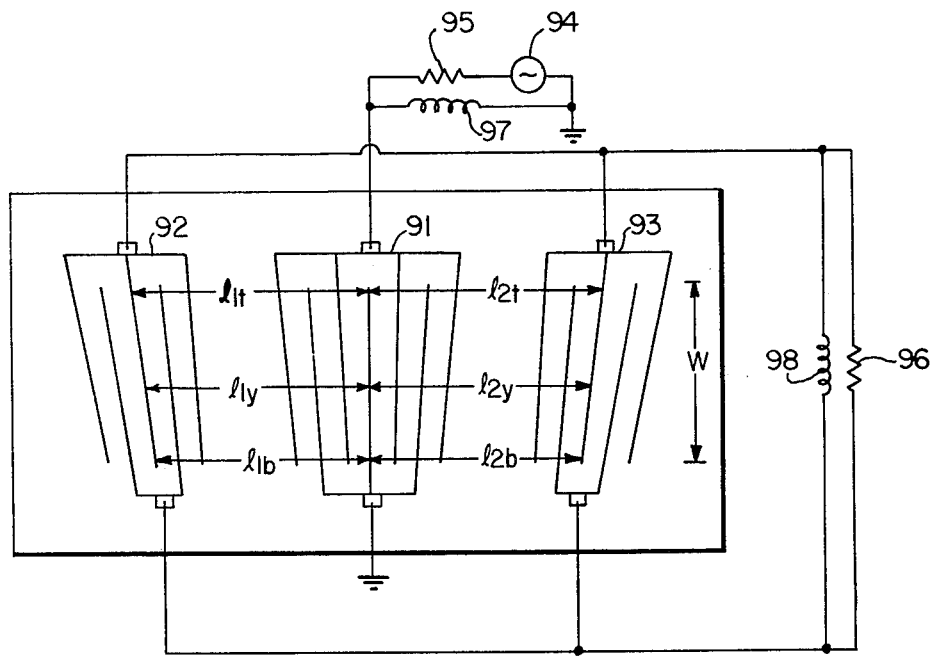
FIG. 9 is a schematic plan view of the surface acoustic wave filter of FIG. 5 and its electrical connection different from that shown in FIG. 5.

Insertion loss continually decreases as $\alpha$ increases, and on the other hand ripple in group delay becomes minimum when $\alpha = 0.3$ to 0.4. From the table 1, it is apparent that the present invention is effective. Preferable values of $\alpha$ may be 0.15 to 0.45 for small ripple in group delay and relatively low insertion loss. Most preferable relations between $l_{1t}$, $l_{2t}$, $l_{1b}$ and $l_{2b}$ (in particular differences such as $l_{1b} - l_{1t}$ and $l_{2b} - l_{2t}$) depend on impedances of the source and the load. In the example described above, the relations are $l_{1t} = l_{2t} = 26.0\ \lambda_0$ and $l_{1b} = l_{2b} = 26.3\ \lambda_0$ and $l_{1b} - l_{1t} = l_{2b} - l_{2t} = 0.3\ \lambda_0$ (i.e. $\alpha = 0.3$). Other relations such as $l_{1t} = l_{2t} = 30\ \lambda_0$ and $l_{1b} = l_{2b} = 30.3\ \lambda_0$ resulted in similar effects as mentioned above. The most preferable relations further depend on other configurations of the first, second and third transducers for other configurations of transducers, such as transducers one of which has finger number different from that of another, transducers one of which has a center frequency different from that of another, and transducers one of which is apodized (length-weighted or gap-weighted). That is, preferable relations are determined mainly by the center frequencies of the transducers, the numbers of fingers of the transducers and the shape of the finger or apodizing. Practically, $l_{1t} = l_{2t}$ and $l_{1b} = l_{2b}$ are preferable. The inductors 17, 19 can be connected in series to the source and the load. Sometimes series inductors are preferable for impedance matching, when input and output impedances of the SAW filter are large compared with those of the source and load. Further, sometimes the second and the third transducers are connected in parallel as shown in FIG. 9 which will be illustrated later. Even in this case, similar results can be obtained.

Figure 3:
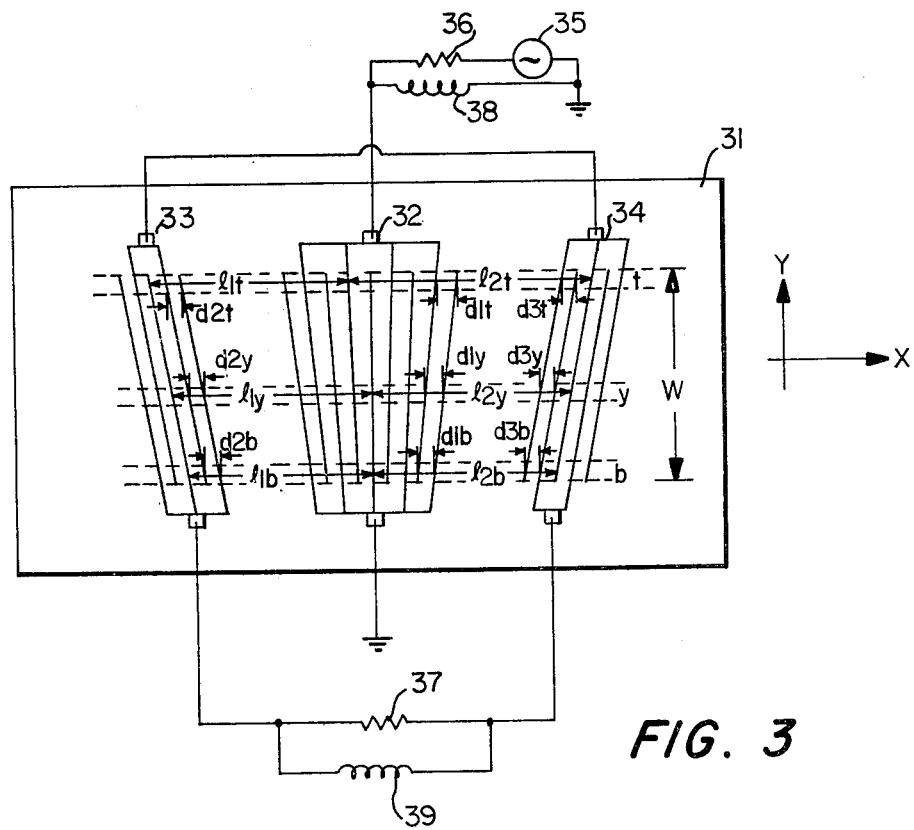
FIG. 3 is a schematic plan view of one embodiment of another surface acoustic filter of the present invention and its electrical connection.

Another example is shown in FIG. 3. In FIG. 3, source 35 is connected to the first transducer 32. The resistor 36 represents an internal resistance of the source 35. The second and the third transducers are connected in series through a resistor 37 for output load. These transducers are deposited on a piezoelectric substrate 31. Inductors 38, 39 are connected for tuning. The first transducer 32 is tapered as shown, wherein distances $d_1$ between centers of adjacent fingers vary along the Y-direction perpendicular to the X-direction parallel to the direction of surface acoustic wave propagation. That is, $d_{1t} \ne d_{1b}$. On the other hand, distances of between centers of adjacent fingers for the second and the third transducers 33, 34 are constant along the Y-direction. That is, $d_{2t} = d_{2b}$ and $d_{3t} = d_{3b}$. The distance such as $l_{1t}$ and $l_{1b}$ between the first and the second transducers 32, 33 and the distance such as $l_{2t}$ and $l_{2b}$ between the first and the third transducers 32, 34 vary along the Y-direction where the distances such as $l_{1t}$, $l_{1b}$, $l_{2t}$ and $l_{2b}$ between the first and the second transducers and between the first and third transducers mean distances between the center lines of the three transducers. The subscripts t and b of $d_{1t}$, $d_{1b}$, $d_{2t}$, $d_{2b}$, $d_{3t}$, $d_{3b}$, $l_{1t}$, $l_{1b}$, $l_{2t}$ and $l_{2b}$ mean positions at the top parts and the bottom parts of the overlapped portions (W) as shown by the broken lines. The positions denoted by "y" mean positions positioned at y.

In FIG. 3, the "y" position is the Y position of the center between two parallel lines (parallel to the x direction) to define a segment in each of the three transducers wherein the two parallel lines are spaced as much as possible under the condition that the distance between the center lines of the first and the second transducers and the distance between the center lines of the first and the third transducers can be regarded as constant at any Y position between the two parallel lines. According to the present invention, the distance between the center lines of the first and the second transducers and also the distance between the center lines of the first and the third transducers are required to vary linearly along the Y-direction in order to attain the ripple suppression of the amplitude responses. That is, by using the definition of the "y" position defined above, the points on the center line of each of the second and the third transducers at all y positions are required to be positioned on or substantially on a straight line inclined relative to the vertical center line of the first transducer. This linear variation of the distances between the three transducers along the Y-direction is a requirement for every example of the present invention.

Figure 4:
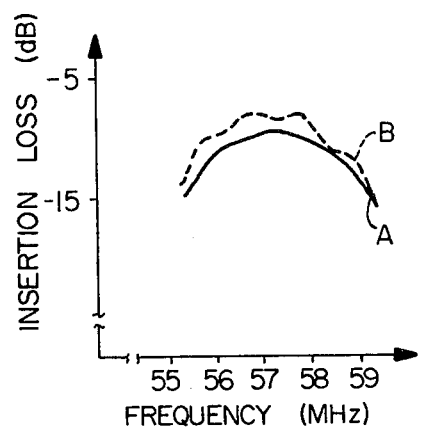
FIG. 4 is a graph of amplitude responses of the surface acoustic wave filter of FIG. 3 and of a conventional surface acoustic wave filter.

In these configurations, center frequency of the first transducer 32 at the position y is defined as:

$(f_0)_{1y} = v/2d_{1y}$, where v is velocity of the surface acoustic wave. The center frequency of the first transducer 32 varies along the Y-direction or for each position. On the other hand, center frequencies $(f_0)_2$ and $(f_0)_3$ of the second and the third transducers are constant, regardless of the y position. Characteristics of the SAW filter of FIG. 3 and the conventional three-transducer type filter are shown in FIG. 4, in both of which finger numbers of the first, the second and the third transducers are the same (32), source resistor and load resistor are the same (50 Ω), inductors 38, 39 for tuning are also the same (0.1 μH), width is 0.3 mm, and the substrate is ceramics as used in the example of FIG. 1. In FIG. 4, curve A drawn by the solid line represents the results for the filter shown in FIG. 3, where $(f_0)_{1t} = (f_0)_2 = (f_0)_3 = 57$ MHz, $(f_0)_{1b} = 57.675$ MHz, $l_{1t} = l_{2t} = 26.0$ $(\lambda_0)_{1t} = 26.0 \times \times v/(f_0)_{1t} = 1.063$ mm, $l_{1b} = l_{2b} = 18.0$ $(\lambda_0)_{1b} + 8.0$ $(\lambda_0)_2 = 18.0 \times v/(f_0)_{1b} + 8.0 \times v/(f_0)_2 = 1.054$ mm and $(f_0)_{1y}$ is varied linearly between $(f_0)_{1t}$ and $(f_0)_{1b}$, where 8.0 wave length is for the first transducer, 10.0 wave length is for the space between the first and the second or between the first and the third transducers and 8.0 wave length for the second or the third transducers. In this example, $\alpha = 0.22$ when $\alpha$ is expressed as an equation $\alpha = |l_{1t} - l_{1b}|/(\lambda_0)_{1t}$. (The wave lengths $(\lambda_0)_{1t}$ and $(\lambda_0)_{1b}$ are different only by small amount (less than one or two percent), then the value $\alpha$ changes by only a few percent even if $(\lambda_o)_{1t}$ is changed to $(\lambda_o)_{1b}$. Curve B drawn by the broken line represents the results for the conventional filter where $(f_0)_{1t} = (f_0)_{1b} = (f_0)_3 = (f_0)_4 = 57$ MHz, $l_{1t} = l_{2t} = l_{1b} = l_{2b} = 1.063$ mm. It is apparent that the present invention produces advantageous results. Good results can also be obtained even when the value of $\alpha$ is from 0.15 to 0.45 by changing the spaces between the transducers, in the present invention represented by FIG. 3. Further, $(f_0)_{1b}$ can be varied between 57.45 and 58.35 MHz. (This corresponds to $\alpha = 0.1$ to 0.45). From study on the configuration of FIG. 3, it has been found according to the present invention that for reducing ripples in the resultant amplitude responses of the filter it is preferable for the distances $l_{1y}$, $l_{2y}$ to satisfy the equation:

$$l_{1y} = l_{2y} \approx n \times v/(f_0)_{1y} \quad (2)$$

where n is constant, and the center frequency $(f_0)_{1y}$ varies linearly from $(f_0)_{1t}$ to $(f_0)_{1b}$. $(f_0)_{1t}$ and $(f_0)_{1b}$ are determined from the equations (1) and (2). The optimum value of the center frequency $(f_0)_{1t}$ and $(f_0)_{1b}$, i.e., the optimum value of $\alpha$, should be determined from a center frequency of the required pass band and parameters such as the number of fingers of each transducer, the shape of the finger (apodized finger) and so on. Although the center frequency $(f_0)_{1y}$ and distances $l_{1y}$, $l_{2y}$ are varied linearly in the example, it is not necessary that the linearity be very exact. If deviation of $(f_0)_{1y}$ from the linear is small as compared with $(f_0)_{1t} - (f_0)_{1b}$, good results can be obtained. And also small deviations of $l_{1y}$ and $l_{2y}$ from exact linearity are allowed. For example, in the preferable case that satisfies the equation $l_{1y} = l_{2y} = n \times v/(f_0)_{1y}$, $l_{1y}$ and $l_{2y}$ are not linear when $(f_0)_{1y}$ is designed to vary linearly although they are approximately linear because the range of $(f_0)_{1y}$ is small.

Figure 5:
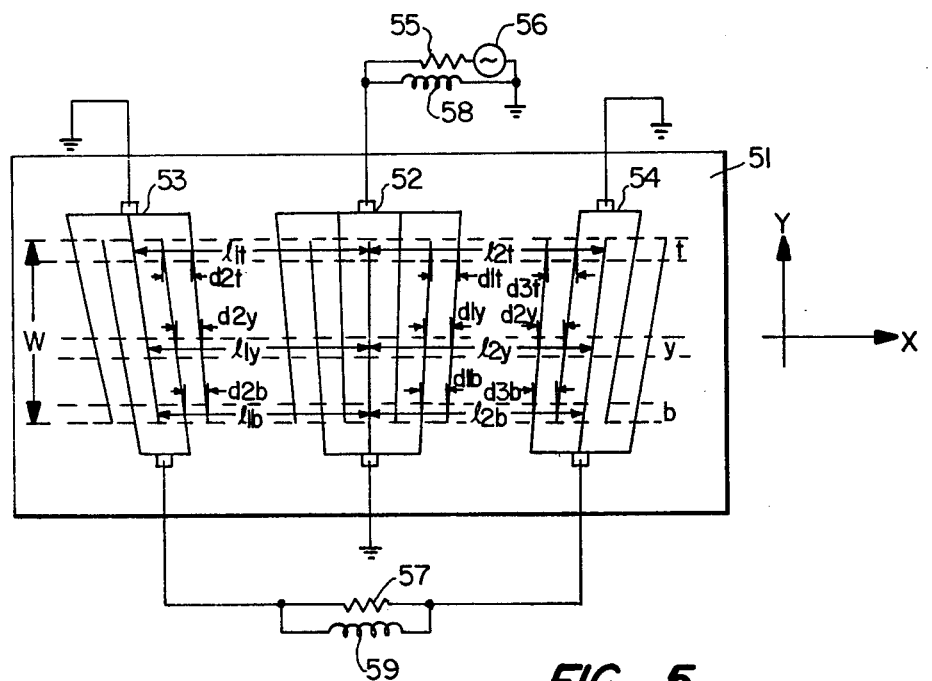
FIG. 5 is a schematic plan view of one embodiment of another surface acoustic wave filter of the present invention and its electrical connection.

Another example of the filter of the present invention is shown in FIG. 5. FIG. 5 is basically the same as FIG. 3, except that only the second and the third transducers 53, 54 are different from those of the example in FIG. 3. They are tapered like the first (central) transducer 52, that is $d_{1t} \neq d_{1b}$, $d_{2t} \neq d_{2b}$ and $d_{3t} \neq d_{3b}$. In FIG. 5, $d_{1y}$, $d_{2y}$ and $d_{3y}$ are the distances at position y in the Y-direction between centers of adjacent fingers of each of the first, the second and the third transducers, respectively, and $d_{1y}$, $d_{2y}$, $d_{3y}$ vary approximately linearly along the Y-direction. The notations in FIG. 5 are the same as those of in FIG. 3. Source 56 having internal resistor 55 applies electrical voltage to the first transducer. The second and the third transducers receive a surface acoustic wave and convert it to an electrical signal across the load or output resistor 57, cooperating in the push-pull mode. The operation is similar to that in the case of each of FIG. 1 and FIG. 3. The inductors 58, 59 are connected for tuning in parallel to the resistors of the source and the load.

Figure 6:
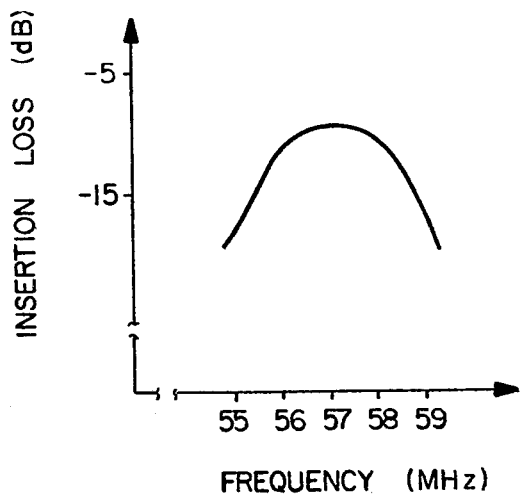
FIG. 6 is a graph of amplitude response of the surface acoustic wave filter of FIG. 5.

Characteristics of the filter of FIG. 5 are shown in FIG. 6 for the case of $(f_0)_{1t} = (f_0)_{2t} = (f_0)_{3t} = 57$ MHz, $(f_0)_{1b} = (f_0)_{2b} = (f_0)_{3b} = 57.675$ MHz, $l_{1t} = l_{2t} = 10(\lambda_0)_{1t} = 10 \times v/(f_0)_{1t} = 1.063$ mm, $l_{16} = l_{2b} = 10(\lambda_0)_{1b} = 10 \times v/(f_0)_{1b} = 1.051$ mm (these values means $\alpha = 0.3$) and other conditions such as characteristic constants of the substrate, width (W) and the number of fingers being the same as those of the example in FIG. 3. It is apparent from FIG. 6 that the ripple in the pass band caused by TTE described before is eliminated as in the cases of the above examples.

In the case of FIG. 5, even if the frequencies $(f_0)_{1b} = (f_0)_{2b} = (f_0)_{3b}$ are varied in the range between 57.45 MHz ($\alpha = 0.1$) and 58.35 MHz ($\alpha = 0.45$) with the frequencies $(f_0)_{1t} = (f_0)_{2t} = (f_0)_{3t}$ unchanged, similar results to those of the case $(f_o)_{1b} = (f_0)_{2b} = (f_0)_{3b} = 57.675$ MHz can be obtained.

It has been again found according to the present invention that for minimizing ripples in the amplitude responses of the filter it is preferable to satisfy an equation.

$$l_{1y}=l_{2y}\approx n\times v/(f_0)_{1y}\approx n'd_{1y}$$

where n and n' are constant and $(f_0)_{1y}$ is a center frequency of the first transducer of a strip positioned at y.

For TV sets or many other usages, filters having two transducers for input and output with different center frequencies are often employed to obtain deep traps at desired frequencies. Results for these cases are also fairly good with respect to the ripple elimination (suppression of TTE), low insertion loss and other characteristics. Further, well known technique to improve SAW filters can also be employed to further improve the SAW filters based on the present invention, such as split electrodes to cancel the reflection of surface acoustic wave caused by acoustic impedance discontinuity, apodized transducer in which length of the finger or width of each finger and the space between fingers are varied to obtain a response matched to an object and so on.

Figure 7:
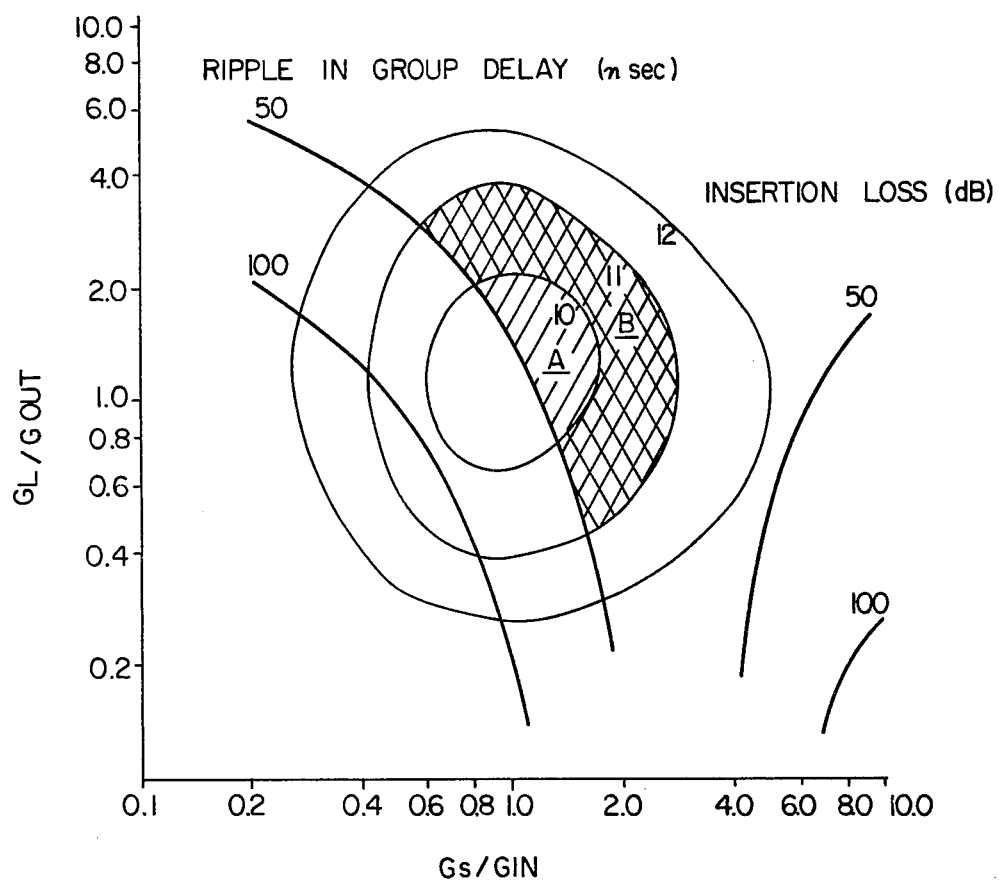
FIG. 7 is a graph showing the relationship between insertion loss and ripple of the surface acoustic wave filter of FIG. 5.

FIG. 7 shows relations between insertion loss and ripple in group delay for the case similar to the example 3 described above, but inductors 58, 59 in FIG. 5 being changed to 0.2 μH. The horizontal axis and the vertical axis represent ratios $G_S/G_{IN}$ and $G_L/G-_{OUT}$ respectively, where $G_S$ is conductance of the source, $G_L$ is conductance of the load, and $G_{IN}=[Re\{Y_{11}\}]max,$ $G-_{OUT}=[Re\{Y_{22}\}]max.$ $[Re\{Y_{11}\}]max$ and $[Re\{Y_{22}\}]max$ mean maximum values of real parts of $Y_{11}$ and $Y_{22}$ respectively which are elements of admittance matrix of SAW filter. The circles in FIG. 7 represent equiinsertion-loss and the V-shaped curves represent equiripple in group delay within a frequency range of 55 MHz to 59 MHz. The figure is a convenient map to know that impedance of source and load should be connected to the SAN filter when insertion loss and ripple in group delay are restricted. For example, if insertion loss less than 10 dB and ripple in group delay less than 50 nsec are desired, conductances of the source and the load within the region shown by hatched area A should be employed. In this case of the SAW filter of FIG. 5 since $G_{IN}$ and $G-_{OUT}$ are about 14 mv and 7 mv respectively, 20 mv and 10 mv may be proper values as $G_S$ and $G_L$ respectively. For another example, if insertion loss between 10 dB and 11 dB and ripple in group delay less than 50 nsec are desired, conductances of the source and the load within the region shown by cross-hatched area B should be employed.

Figure 8:
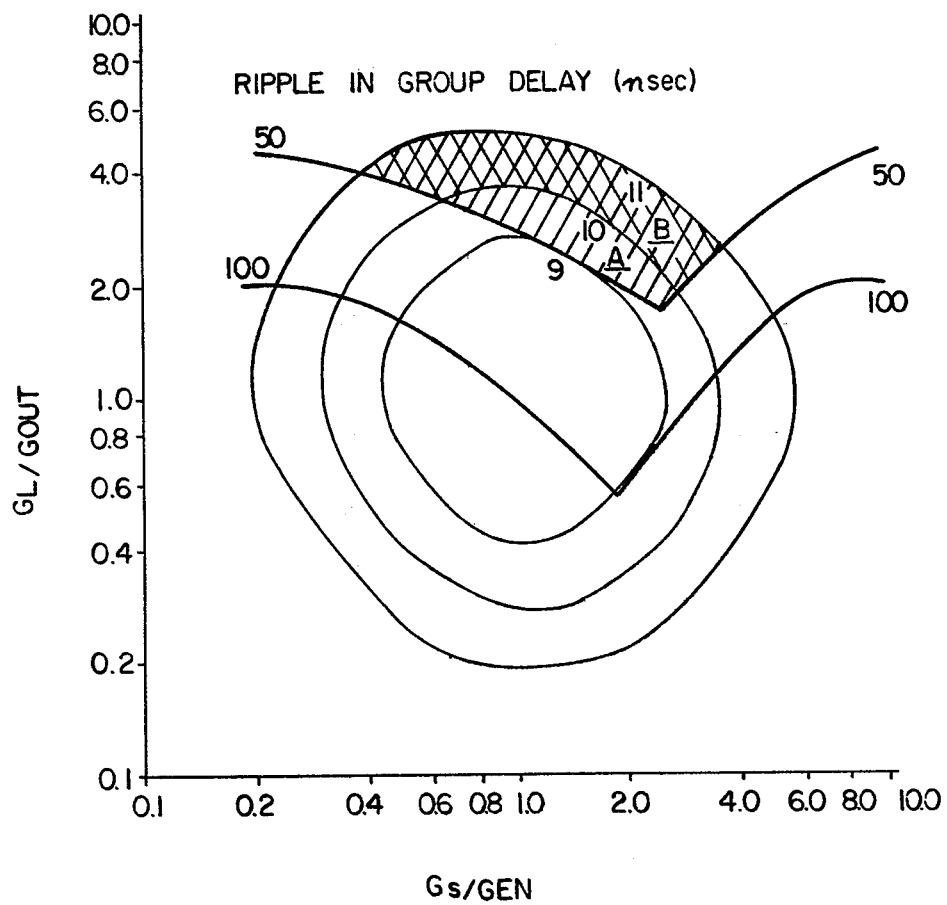
FIG. 8 is a graph showing the relationship between insertion loss and ripple of a conventional surface acoustic wave filter.

FIG. 8 is a figure drawn in the same manner as in FIG. 7 for the case of a conventional SAW filter with three transducers in which all transducers are taperless (non-tapered) and also the second and the third transducers are parallel (noninclined). Other conditions are the same as those of the SAW filter illustrated with FIG. 7. The regions shown by hatched area A and cross-hatched area B are smaller than those of FIG. 7. This means that the SAW filters of the present invention can operate within a wider range of impedances of source and load, that is, allowance of impedances of source and load is wider. Further, according to calculation, in the case of the present invention (FIG. 7), ripple in group delay becomes very small when $G_S/G_{IN}$ is 2 to 4. This feature cannot be obtained in the case of conventional filters (FIG. 8).

The curves in FIG. 7 and FIG. 8 are influenced by the inductors or capacitors connected in parallel or series to the source and the load, and further by losses such as propagation loss of surface acoustic loss, resistive loss of the electrodes, loss by spreading of the acoustic beam, loss electrical components such as inductors or capacitors and so on. When $G_S$ and $G_L$ are apart from the proper region in FIG. 7, proper impedance conversion may be required. Such impedance conversion can be done by using capacitors and inductors or a transformer. The present invention produces remarkable performance even for the cases of such impedance conversion.

FIG. 9 shows another example of the present invention in which the second and the third transducers as shown in FIG. 5 are connected in parallel. In FIG. 9 the source 94 with internal resistor 95 is connected to the first transducer 91. The second and the third transducers 92, 93 are connected in parallel to convert an acoustic wave to an electrical output signal across a load resistor 96. The parallel inductors 97 and 98 for tuning are also connected just in the cases of previous examples. In the example in FIG. 9, the phase of the output signal of the third transducer is opposite to that of FIG. 5 to effectively produce an output signal across the load 96 in cooperation with the second transducer. Almost all of the discussions about the examples of series connection (FIG. 5, FIG. 7) can be applied to this example. That is, good ripple suppression can be obtained under the condition $|l_{1t}-l_{1b}|=|l_{2t}-l_{2b}|=\alpha\lambda_0$, and better ripple suppression can be obtained when $l_{1y}=l_{2y}\approx n\times v/(f_0)_{1y}$. Fairly good results can be obtained by this example.

Figure 10:
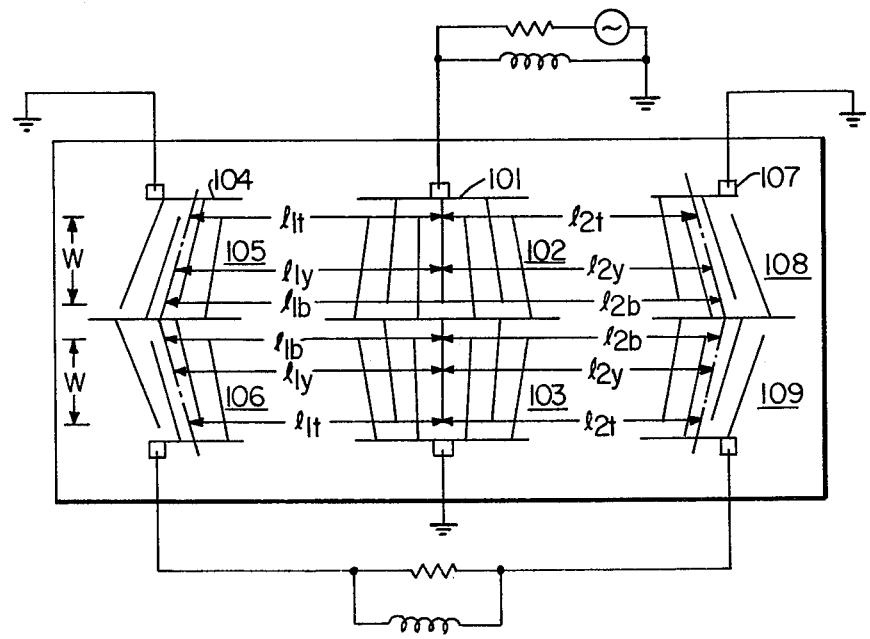
FIG. 10 is a schematic plan view of one embodiment of another surface acoustic wave filter of the present invention and its electrical connection.

Another example is shown in FIG. 10, in which the first (input) transducer 101, the second and the third transducers 104, 107 have different shapes from those of the examples mentioned above. The first transducer 101 is divided in parallel to the X-direction (direction of propagation of surface acoustic wave) into two transducers 102, 103 connected in series. The second and the third transducers 104, 107 also are divided into two parts 105, 106 and 108, 109, respectively, in the same manner as in the case of the first transducer.

Operation of the example in FIG. 10 is the same as that in FIG. 5. Their example is different from the prior examples in that higher impedances of the first, the second and the third transducers can be obtained.

For suppressing side-band rejection and obtaining desired amplitude-frequency or phase-frequency response, length weighting for apodizing is commonly used. This length-weighting method can be also applied to the present invention. However, a slight modulation of the usual length-weighting method is preferable for better performances. In FIG. 10 also, good results of ripple suppression can be obtained when $|l_{1t}-l_{1b}|=|l_{2t}-l_{2b}|=\alpha\lambda_0$, and better resutls can be obtained when $l_{1y}=l_{2y}\approx n\times v/(f_0)_{1y}$.

Figure 11:
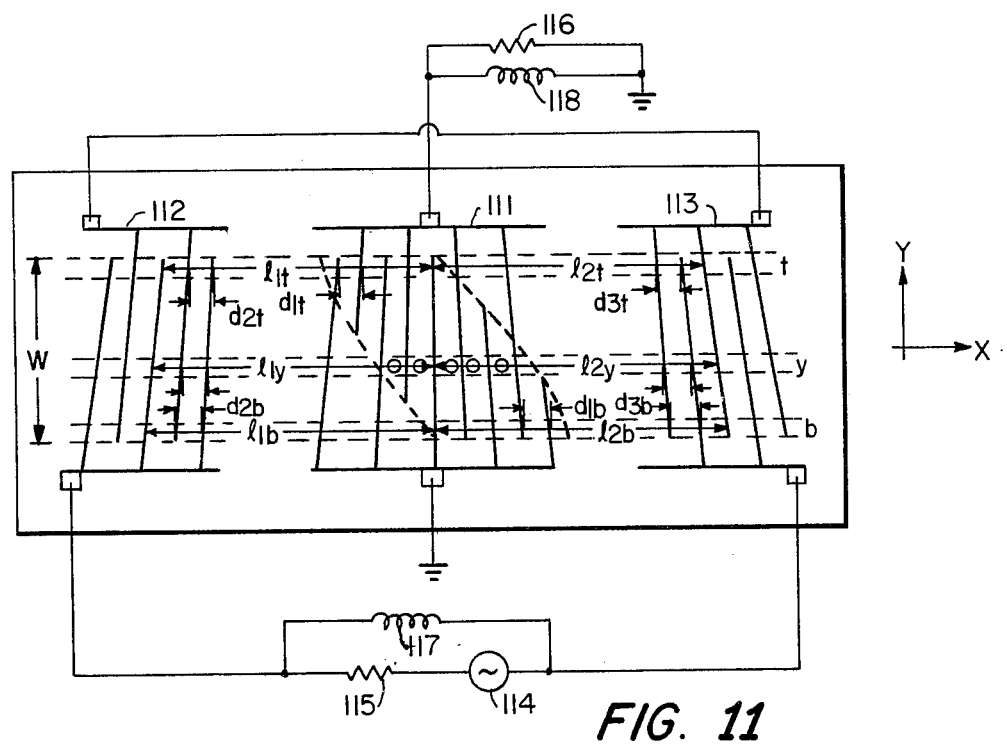
FIG. 11 is a schematic plan view of one embodiment of still another surface acoustic wave filter of the present invention and its electrical connection.

FIG. 11 shows another example which is a modulation of FIG. 5 and preferably length-weighted. The first transducer 111 is length-weighted or apodized in a special manner. The broken line is an envelope connecting the tips of fingers of the comb-type electrode array. The envelope is different from that of the usual one such as A and B in FIG. 12, although, in B, the comb-type electrode arrays are tapered as shown. The envelope of the first transducer in FIG. 11 is made in such a manner that, when the first transducer 111 is an input transducer and imaginarily divided into many narrow strips as shown, the energy of the surface acoustic wave generated in each strip is nearly equal to that of each of the other strips. That is, the energy of the surface acoustic wave launched by the first transducer is uniform over the width (W) or along the Y-axis in the width (W). In other words, the number of sections in a strip positioned at y which are indicated by circles and which radiate a surface acoustic wave propagating along the strip does not change largely among the strips.

In FIG. 11, a source 114 with internal resistor 115 is connected to the second and the third transducers 112, 113 and the first transducer 111 is connected to a load resistor 116. In this example the input and output transducers are exchanged as is different from the case of the example shown in FIG. 5. This exchange always results in the same amplitude or phase response as those before the transducer exchange so long as the impedances of the source and the load including inductors are identical.

Figure 12:
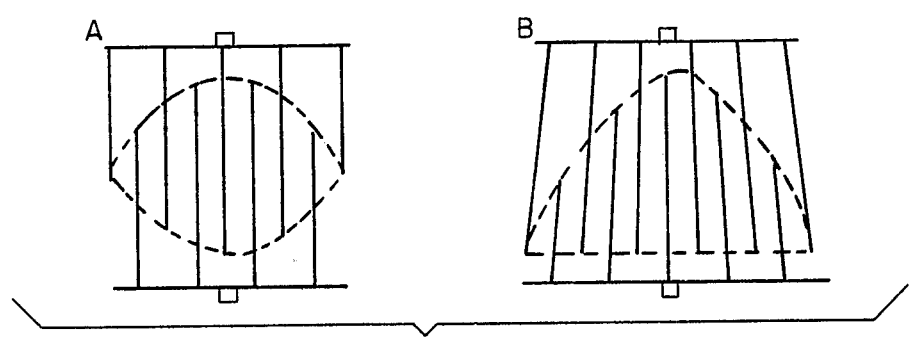
FIG. 12A and 12B are schematic drawings showing kinds of length-weighting of interdigital electrodes.
Figure 13:
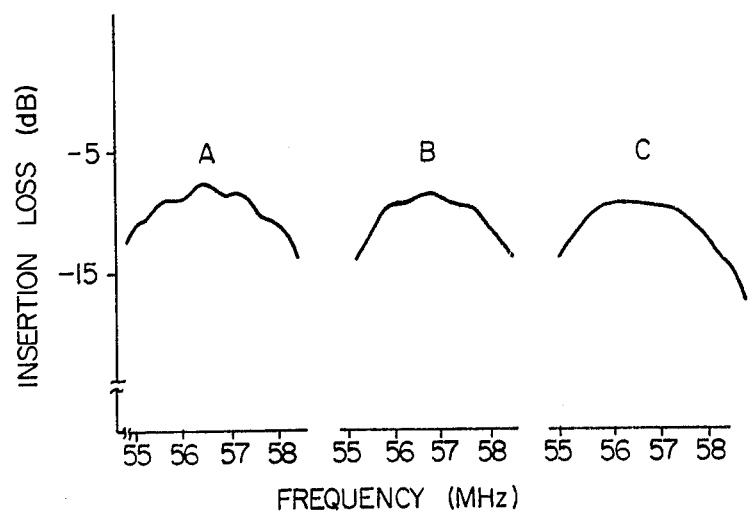
FIG. 13 is a graph of amplitude responses of the surface acoustic wave filter of FIG. 11, a surface acoustic wave filter with a length-weighting different from that of FIG. 11, and a conventional surface acoustic wave filter with known length-weighting.

FIG. 13 shows characteristics of the SAW filters shown in FIG. 11 and FIG. 12. The resistors 115 and 116 are 50 Ω and the inductors 117 and 118 are 0.2 μH. The piezoelectric substrate is made of a ceramics of a solid solution of lead titanate-lead zirconate-lead magnesium niobate as described before. The width (W) is 0.3 mm. The numbers of fingers of the first, the second and the third transducers are 32, 56 and 32 respectively. The first transducer is length-weighted by a weighting function $\sin \pi x/\pi x(1-x^2)$ ($|x| \leq 2$, $x = \pm 2$ at the edge of the transducer).

Curve A shows the results of a conventional transducer configuration, that is, in FIG. 11, $d_{1t}=d_{2t}=d_{3t}=d_{1b}=d_{2b}=d_{3b}=\alpha_0/2=v/2f_0$ and $l_{1t}=l_{2t}=l_{1b}=l_{2b}=32\lambda_0=32 \ v/f_0$ (i.e. $\alpha=0$) where v is the velocity of the surface acoustic wave and $f_0$ is center frequency 56.5 MHz, and the first transducer is length-weighted as shown in FIG. 12A.

The curve B shows the results of one example of the present invention in which using the definition in FIG. 11, $\alpha=0.3$ is employed and $l_{1t}=l_{2t}=32\lambda_{0t}=32 \ v/f_{0t}$, $f_{0t}=57.04$ MHz, $l_{1b}=l_{2b}=32\lambda_{0b}=32 \ v/f_{0b}$, $f_{0b}=56.5$ MHz ($l_{1b}-l_{1t}\approx 0.3\lambda_{0t}\approx 0.3\lambda_{0b}$), $d_{1t}=d_{2t}=d_{3t}=\lambda_{0t}/2=v/2f_{0t}$, and $d_{1b}=d_{2b}=d_{3b}=\lambda_{0b}/2=v/2f_{0b}$, where $\lambda_{0t}$ is the wavelength of the surface acoustic wave at center frequency $f_{0t}$ at the position t, $\lambda_{0b}$ is the wavelength of the surface acoustic wave at center frequency $f_{0b}$ at the position b and the first transducer is length-weighted as shown in FIG. 12B.

The curve C shows the results of another example of the present invention, differing from the above example only in the shape of the envelope of length-weighting and having a shape as shown in FIG. 11.

Figure 14:
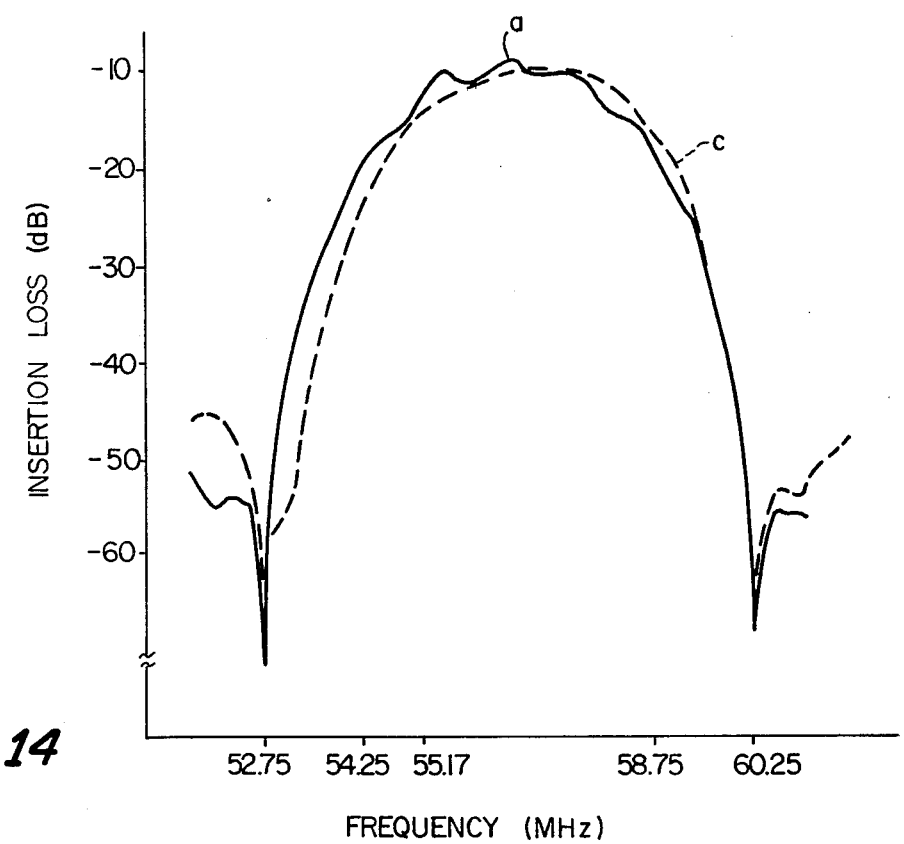
FIG. 14 is a graph of measured amplitude responses of the surface acoustic filter of FIG. 11 and a conventional surface acoustic filter.

FIG. 14 shows amplitude responses of the curve A and C in FIG. 13 for a wider frequency region. The SAW filter is prepared for a television video inter frequency filter of a Japanese channel.

Figure 15:
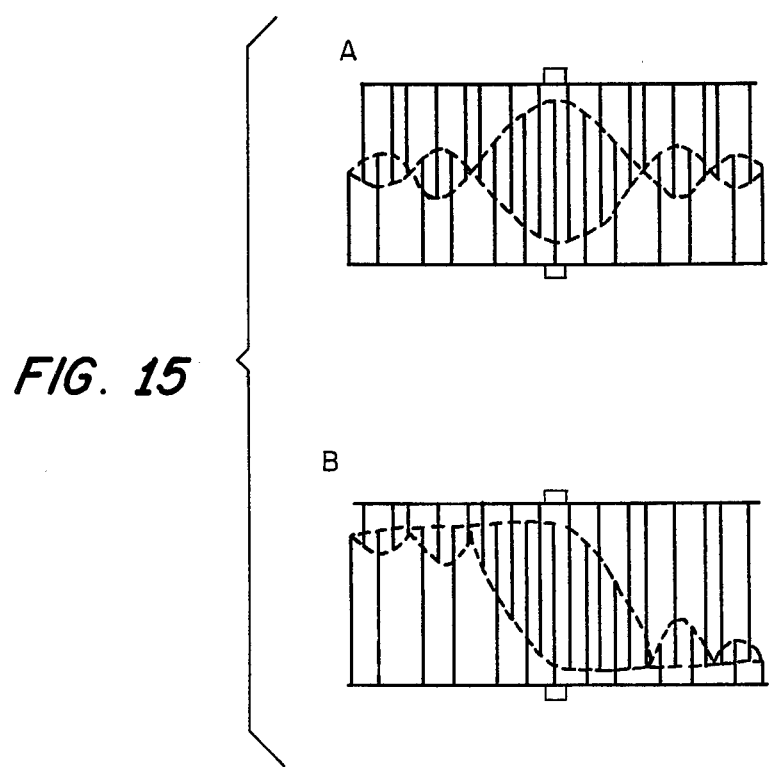
FIGS. 15A and 15B are schematic drawings showing modification of length-weighting with the weighting function unchanged.

In the above example, the uniformity of the energy of the surface acoustic wave over the width (W) is important. There are cases in which modification of the envelope to make uniform the acoustic energy over width (W) is difficult, for example the case that the envelope has side peaks as shown in FIG. 15A. However, the energy generated by the side peaks does not so largely effect the ripple. It can be assured that a shape of the envelope shown in FIG. 15B leads to preferable results.

The second and the third transducers also can be apodized instead of the first transducer. In this case, it is preferable that both the second and the third transducers are apodized by the same weighting functions each of which is symmetric with respect to the center line of the first transducer.

In FIG. 11 also, good results of ripple suppression can be obtained when $|l_{1t}-l_{1b}|=l_{2t}-l_{2b}|=\alpha\lambda_0$, and better results can be obtained when $l_{1y}=l_{2y}\approx n\times v/(f_0)_{1y}$.

Figure 16:
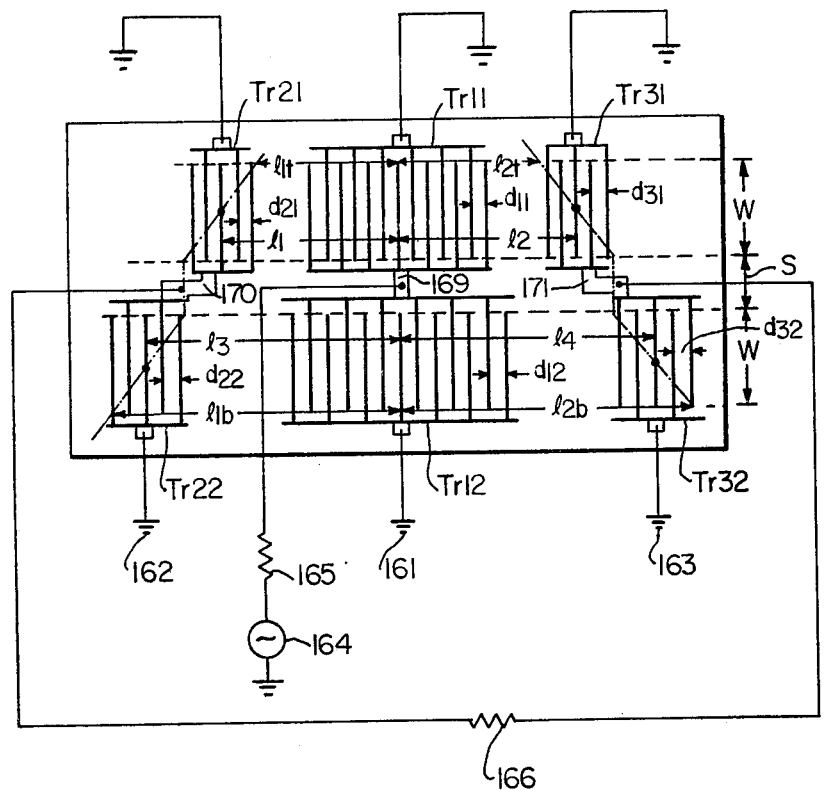
FIG. 16 is a schematic plan view of one embodiment of another surface acoustic wave filter of the present invention and its electrical connection.
Figure 16:
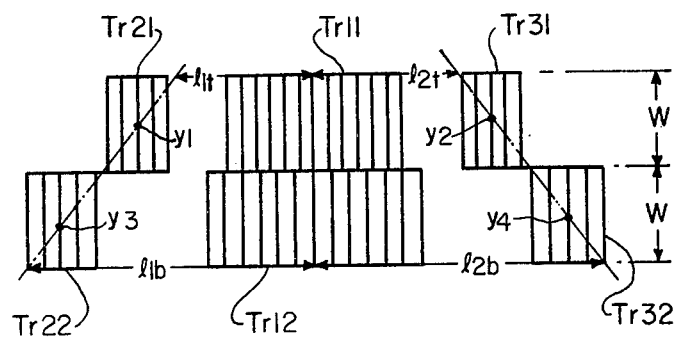

Another example which is a little different from the prior examples, is shown in FIG. 16. FIG. 16 shows the case where $l_{1y}$ and $l_{2y}$ are designed to discretely vary along the Y direction, although in the previous examples $l_{1y}$ and $l_{2y}$ vary continuously along the Y direction. In FIG. 16, the first transducer 161 consists of two transducers $Tr_{11}$, $Tr_{12}$ which are identical to each other or different from each other in center frequency (the distance between the centers of fingers such as $d_{11}$, $d_{12}$) and are connected in parallel. The second transducer 162 also consists of two identical or two different transducers (different in center frequency) $Tr_{21}$, $Tr_{22}$ connected in parallel. Further, the third transducer 163 also consists of two identical or two different transducers (different in center frequency) $Tr_{31}$, $Tr_{32}$ connected in parallel, $l_1$, $l_2$, $l_3$ and $l_4$ are distances between center lines of the transducers. In the present invention, an improved point is that the distances $l_1$ and $l_2$ are different from the distances $l_3$ and $l_4$. The transducer $Tr_{21}$ of the second transducer and the transducer $Tr_{31}$ of the third transducer are located so as to receive surface acoustic waves launched by the transducer $Tr_{11}$ of the first transducer. The transducer $Tr_{22}$ of the second transducer and the transducer $Tr_{32}$ of the third transducer are located so as to receive surface acoustic waves launched by the transducer $Tr_{12}$ of the first transducer. Each of the six transducers $Tr_{11}$, $Tr_{12}$, $Tr_{21}$, $Tr_{22}$, $Tr_{31}$, $Tr_{32}$ consists of two comb-type electrode arrays with parallel electrodes (parallel fingers). Center frequencies of the six transducers $Tr_{11}$, $Tr_{12}$, $Tr_{21}$, $Tr_{22}$, $Tr_{31}$ and $Tr_{32}$ are $f_{11}$, $f_{12}$, $F_{21}$, $F_{22}$, $F_{31}$ and $F_{32}$, respectively.

An electrical signal generated by a source 164 with internal resistor 165 is applied to transducers $Tr_{11}$ and $Tr_{12}$ of the first transducer through common electrode 169. Surface acoustic waves radiated by the transducers $Tr_{11}$ propagate toward transducer $Tr_{21}$ and transducer $Tr_{31}$. On the other hand, the common electrode 170 of $Tr_{21}$ and $Tr_{22}$ of the second transducer is connected to the common electrode 171 of $Tr_{31}$ and $Tr_{32}$ of the third transducer through a resistor 166. Surface acoustic waves radiated from $Tr_{11}$ are received by $Tr_{21}$ and $Tr_{31}$ and generate electrical signals across the resistor 166. All energy of the surface acoustic waves is not converted to an electrical signal. A part of the incident acoustic energy passes through the transducers $Tr_{21}$ and $Tr_{31}$, a part of the energy is reflected as a surface acoustic wave propagating toward the transducer $Tr_{11}$, and a part of the energy is fed to the transducers $Tr_{22}$ and $Tr_{32}$ to regenerate a surface acoustic wave. Such process also occurs for the transducer $Tr_{12}$, $Tr_{22}$ and $Tr_{32}$. In such a manner, the six transducers highly interact with each other.

Figure 17:
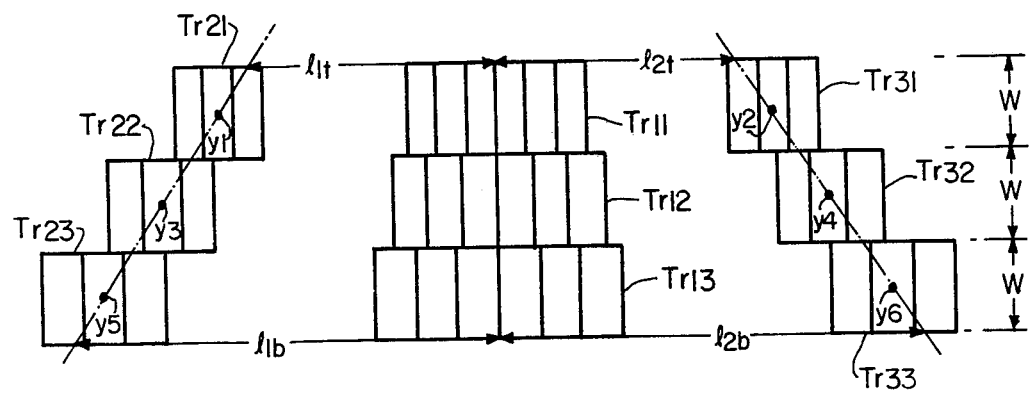
FIG. 17 is a graph of amplitude responses of the surface acoustic wave filter of FIG. 16 and a conventional surface acoustic wave filter.
Figure 17:
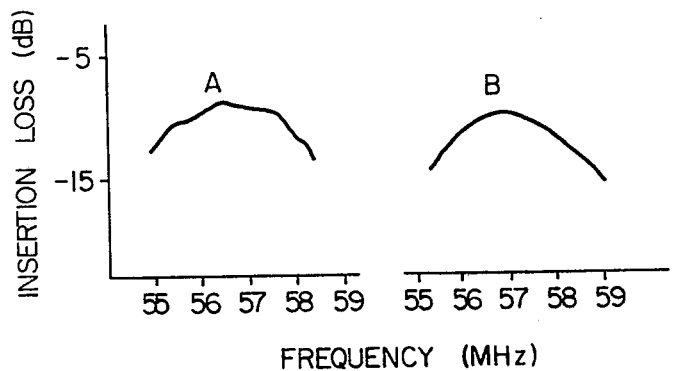

In FIG. 17, characteristics of a SAW filter are shown, in which the numbers of fingers are the same 32 for all of the transducers $Tr_{11}$, $Tr_{12}$, $Tr_{21}$, $Tr_{22}$, $Tr_{31}$ and $Tr_{32}$. An inductor of 0.2 μH and a capacitor of 30 pF are connected in parallel to the source 164 with internal resistor 50 Ω. And also, an inductor of 0.1 μH and a capacitor of 30 pF are connected in parallel to the output load 166, 50 Ω. The width of one transducer, such as $Tr_{11}$, $Tr_{12}$ and etc, is 0.3 mm. The piezoelectric substrate is a ceramics of a solid solution of lead titanate-lead zirconate-lead magnesium niobate as described before.

The curve A in FIG. 17 shows results of a conventional case in which transducers $Tr_{12}$, $Tr_{22}$ and $Tr_{32}$ are removed in FIG. 16 without any change in electrical connection, the width (W) is 0.6 mm instead of 0.3 mm, $d_{11}=v/2f_{11}=d_{21}=v/2f_{21}=d_{31}=v/2f_{31}$, $l_1=l_2=26\ v/f_{11}$, and $f_{11}=f_{21}=f_{31}=56.5$ MHz where v is the velocity of the surface acoustic wave.

The curve B in FIG. 17 shows results of one example of the present invention, in which the condition $l_3-l_1=l_4-l_2\approx 0.15\lambda_0$ is employed, then $l_{11}=v/2f_{11}=d_{21}=v/2f_{21}=d_{31}=v/2f_{31}$, $l_1=l_2=26\ v/f_{11}$ ($f_{11}=f_{21}=f_{31}=56.80$ MHz), $d_{12}=v/f_{12}=d_{22}=v/f_{22}=d_{32}=v/f_{32}$, and $l_3=l_4=26\ v/f_{12}$ ($f_{12}=f_{22}=f_{32}=56.5$ MHz). In FIG. 16, good results can be obtained under the condition $l_3-l_1=l_4-l_2=0.075\sim 0.225\lambda_0$. This condition is effectively equivalent to the condition $|l_{1t}-l_{1b}|=|l_{2t}-l_{2b}|=\alpha\lambda_0$ as defined before. Better results can be obtained when $l_{1y}=l_{2y}\approx n\times v/(f_0)_{1y}$. In FIG. 16, $l_{16}$ is $l_1$ or $l_3$ and $l_{2y}$ is $l_2$ or $l_4$.

The lengths $l_{1t}$, $l_{1b}$, $l_{2t}$, $l_{2b}$ for FIG. 16 corresponding to those defined before are apparent from FIG. 16, FIG. 16' and FIG. 16''. That is, referring to FIG. 16, the combination of the two segmental transducers $Tr_{21}$ and $Tr_{22}$ constitutes a second transducer. A straight line passing both the centers $y_1$ and $y_2$ of the center lines of the two segmental transducers is drawn as shown by the dotted line. In drawing the dotted line, the space S should be neglected because variation of the length of the space S does not affect the basic amplitude responses. FIG. 16' thus shows an effective portion of a transducer pattern equivalent to FIG. 16. In the case of the example of FIG. 16 or FIG. 16', the length $l_{1t}$ is the distance between the dotted line and the center line of the segmental transducer $Tr_{11}$ at the top part thereof within the width W. Likewise, the length $l_{1b}$ is the distance between the dotted line and the center line of the segmental transducer $Tr_{22}$ at the bottom part thereof within the width w. The lengths $l_{2t}$ and $l_{2b}$ are defined in a similar manner.

In the case of the examples as of FIG. 16, FIG. 16' and FIG. 16'' also, the linear variation of the distances between the three transducers along the Y-direction is required. That is, the points on the center line of each of the second and the third transducers at all "y" positions are required to be positioned on or substantially on a straight line. As for the second transducer, for example, the center line of the segmental transducer $Tr_{21}$ is parallel to the center line of the segmental transducer $Tr_{11}$ of the first transducer. So, the point $y_1$ is an only point at the "y" position in the segmental transducer $Tr_{21}$. Likewise, the point $y_3$ is an only point at the "y" position in the segmental transducer $Tr_{22}$. The requirement of the present invention is that the points on the center line of the second (and third) transducer at the "y" positions are required to be on or substantially on a straight line. Since in the case of FIG. 16 or FIG. 16' the points at the y positions are only two ($y_1$ and $y_3$), the above requirement is apparently met.

The above requirement can more readily be understood from FIG. 16'', which shows an effective portion of another type of SAW filter, in which each of the tree transducers is composed of three segmental trnasducers. The above requirement for FIG. 16'' is that the points in each of the second and third transducers at the y positions ($y_1$, $y_3$, $y_5$ for the second transducer, and $y_2$, $y_4$, $y_6$ for the third transducer) are required to be positioned on or substantially on a straight line as shown in FIG. 16''.

It is apparent from FIG. 17 that the present invention is very effective for reducing the undesired ripple in the pass band. Although in the example described just above, the center frequencies $f_{11}$, $f_{21}$ and $f_{31}$ are identical to each other and also $f_{12}$, $f_{22}$ and $f_{32}$ are identical to each other, preferable combinations of $f_{11}$, $f_{21}$, $f_{31}$, $f_{12}$, $f_{22}$ and $f_{32}$ can be selected to obtain desired responses of amplitude and phase. The case of $f_{11}=f_{12}$, $f_{21}=f_{22}=f_{31}=F_{32}$ and $l_1=l_2\neq l_3=l_4$ can produce good results. With respect to distances of centers of transducers $l_1$, $l_2$, $l_3$ and $l_4$, the relation between the distances is important to obtain good performance.

The relations between the distances $l_1$, $l_2$, $l_3$ and $l_4$ may be changed with the change of parameters such as geometrical dimension of the six transducers (width (W), apodizing, number of fingers and others). The results as shown in FIG. 17B represent merely one example of the present invention, which is one of the preferable examples, that is, $l_1=l_2=n\cdot v/f_{11}$ and $l_3=l_4=n\cdot v/f_{12}$ where n is constant. Apodizing also can be applied to the example in FIG. 16. Apodizing of at least one of six transducers $Tr_{11}$, $Tr_{12}$, $Tr_{21}$, $Tr_{22}$, $Tr_{31}$ and $Tr_{32}$ produces different response of amplitude and phase, with the performance such as elimination of the ripple being retained. It is preferable that in the first transducer, the two transducers $Tr_{11}$ and $Tr_{12}$ are apodized with similar weighting functions.

Figure 18:
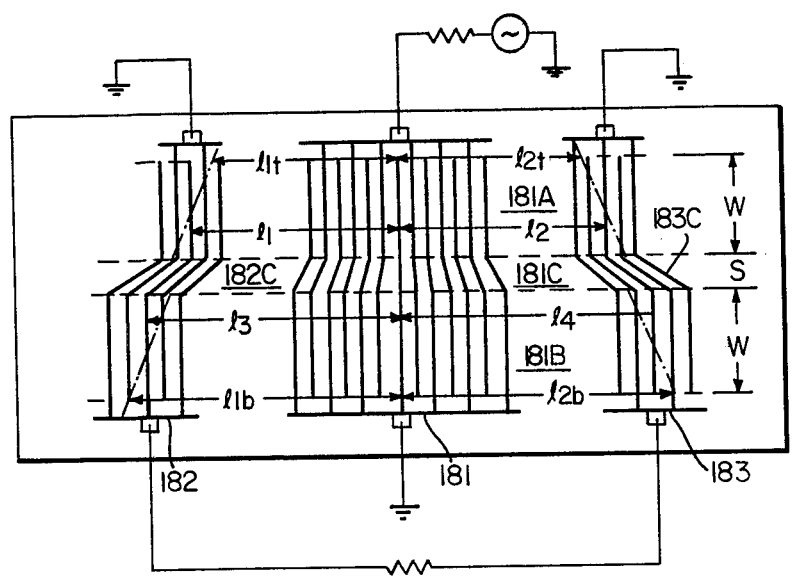
FIG. 18 is a schematic plan view of one embodiment of a surface acoustic wave filter modified from that of FIG. 16 and its electrical connection.

The complex configuration of FIG. 16 can be modified so as to become a simpler configuration which is identical acoustically and electrically to the original complex configuration. One example of the modification is shown in FIG. 18. The first transducer is modified in such a manner that each finger of the transducer $Tr_{11}$ in FIG. 16 is connected to each finger of the transducer $Tr_{12}$. In the same manner the second and the third transducers are modified. In FIG. 18, the first transducer 181 consists of two parts 181A and 181B having different center frequencies. The second and the third transducers 182, 183 also have configurations similar to those of the first transducer. The transient parts 181C, 182C and 183C are usually very small as compared with the width (W) although the parts are drawn exaggeratedly in FIG. 18. The configuration is equivalent to that in FIG. 16. In FIG. 18 also, good results of ripple suppression can be obtained when $|l_{1t}-l_{1b}|=|l_{2t}-l_{2b}|=\alpha\lambda_0$, and better results can be obtained when $l_{1y}=l_{2y}\approx n\times v/(f_0)_{1y}$ where $l_{1y}$ is $l_1$ or $l_3$ and $l_{2y}$ is $l_2$ or $l_4$.

Figure 19:
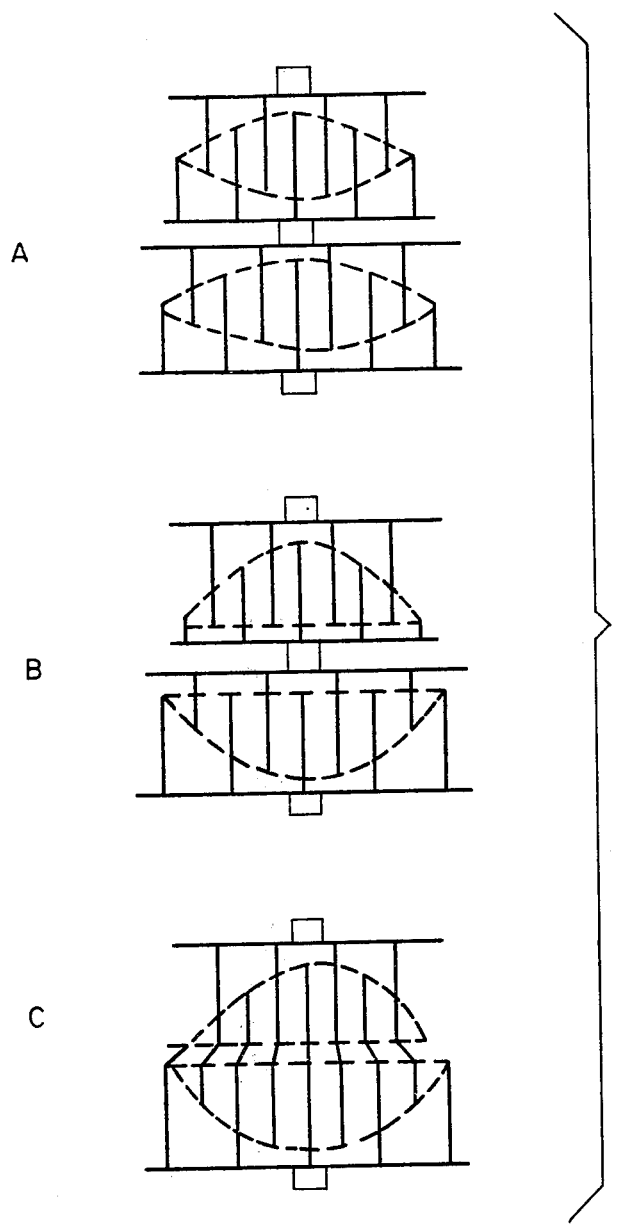
FIGS. 19A, 19B and 19C are schematic drawings showing modifications of length-weighting relating a transformation of the complex configuration of FIG. 16 to the simple configuration of FIG. 18 with the weighting function unchanged.

When length-weighting (apodizing) is done as shown in A of FIG. 19, modification from the configuration of FIG. 16 to the configuration of FIG. 18 is impossible. However, it becomes possible by changing the shape of an envelope connecting the tips of the fingers with the weighting function unchanged as shown in B of FIG. 19. The results are shown in C of FIG. 19.

Figure 20:
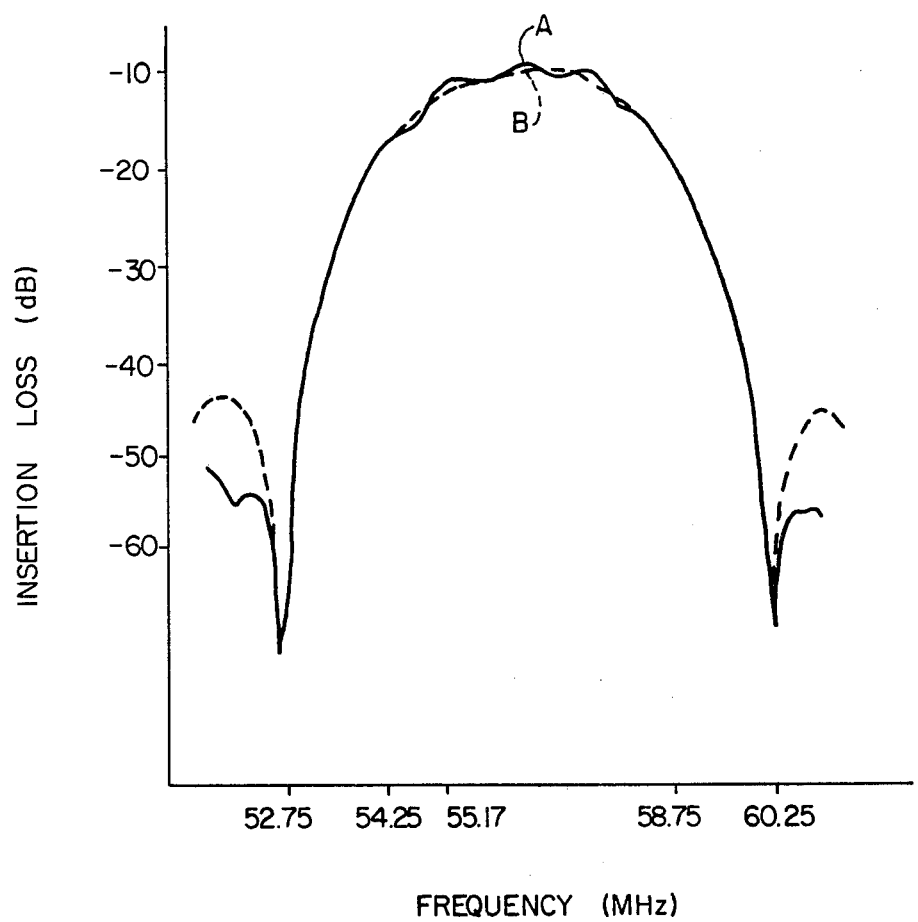
FIG. 20 is a graph of measured amplitude responses of a surface acoustic wave filter similar to FIG. 18 and a conventional surface acoustic wave filter.

FIG. 20 shows experimental results of a SAW filter in FIG. 19C as compared with a SAW filter of a conventional three-transducer configuration. The weighting function is $\sin \pi x/\pi x(1-x^2)$ as mentioned before. The curves A and B represent amplitude responses of the conventional SAW filters and the SAW filter of the present invention, respectively.

Hereinbefore, several examples utilizing the present invention have been described in detail with respect to the accompanying drawings. However, these are only a part of examples of the present invention. To each example, excellent technique well known in aspects of SAW devices can be applied, such as split electrodes or split fingers which substantially cancel the reflection of surface acoustic waves caused by discontinuity of acoustic impedance, apodizing (length-weighting or width-weighting), combination of center frequencies of the first, the second and the third transducers to obtain nul-points at desired frequencies in amplitude response, and also desired amplitude and phase response, and so on.

From the detailed description, it is apparent that the present invention is excellent means to eliminate or decrease ripples in amplitude-frequency and group delay-frequency responses.

Modification of the examples described above within the scope of the present invention may be easy to people working in aspects of SAW devices. Such modifications are included in the present invention so long as the modifications utilize the spirit of the present invention.

What is claimed is:

1. A surface acoustic wave filter with a three-transducer configuration on a piezoelectric substrate in which a first transducer connected to a signal source launches surface acoustic waves, and second and third transducers connected in series or in parallel to a load convert said launched surface acoustic waves to electrical signals, characterized in that said second and said third transducers are arranged in such a manner that a distance between central lines of said first and said second transducers and a distance between central lines of said first and said third transducers vary linearly along a Y-direction which is perpendicular to an X-direction which is parallel to the direction of said surface acoustic waves, with the proviso that $|l_{1t} - l_{1b}| = |l_{2t} - l_{2b}| = \alpha\lambda_0$, where $l_{1t}$ and $l_{1b}$ are distances between the center lines of the first and the second transducers at the top part and the bottom part of the first and second transducers, respectively, $l_{2t}$ and $l_{2b}$ are distances between the center lines of the first and the third transducers at the top part and the bottom part of the first and the third transducers, respectively, $\alpha$ is a coefficient between 0.15 and 0.45, and $\lambda_0$ is a wavelength of a surface acoustic wave at a center frequency at which said first transducer has a maximum response.

2. A surface acoustic wave filter according to claim 1, in which at least said first transducer comprises an array of two comb-type electrodes having plural electrode fingers, and said first transducer is tapered in such a manner that distances between center lines of adjacent fingers of said comb-type electrode array vary approximately linearly along said Y-direction.

3. A surface acoustic wave filter according to claim 2, in which the distance $l_{1y}$ at position y in said Y-direction between the center lines of said first and said second transducers, and the distance $l_{2y}$ at position y between the center lines of said first and said third transducers satisfy the equation $$l_{1y} = l_{2y} \approx n \times v/(f_0)_{1y}$$

where n is an arbitrary constant, v is the velocity of the surface acoustic wave, and $(f_0)_{1y}$ is the center frequency at the position y of said first transducer and $(f_0)_{1y}$ varies linearly along said Y direction.

4. A surface acoustic wave filter according to claim 1, in which each of said first, second and third transducers comprises an array of two comb-type electrodes having plural fingers, and each of said first, said second and said third transducers is tapered in such a manner that distances between center lines of adjacent fingers of said comb-type electrode arrays vary approximately linearly along said Y-direction.

5. A surface acoustic wave filter according to claim 4, in which distance $l_{1y}$ at position y in said Y-direction between center lines of said first and said second transducers and distance $l_{2y}$ at position y in said Y-direction between center lines of said first and said third transducers satisfy the equation $$l_{1y} = l_{2y} \approx n \times v/(f_0)_{1y}$$

where n is an arbitrary constant, and $(f_0)_{1y}$ is a center frequency at position y of said first transducer and $(f_0)_{1y}$ varies linearly along said Y-direction.

6. A surface acoustic wave filter according to claim 1, in which center frequencies $(f_0)_1$, $(f_0)_2$ and $(f_0)_3$ of said first, said second and said third transducers at which each transducer has a maximum response, respectively, are identical to each other.

7. A surface acoustic wave filter according to claim 1, in which center frequency $(f_0)_1$ of said first transducer at which said first transducer has a maximum response is different from identical center frequencies $(f_0)_2$ and $(f_0)_3$ $((f_0)_2 = (f_0)_3)$ at which said second and said third transducer have maximum responses, respectively.

8. A surface acoustic wave filter according to claim 1, in which center frequencies $(f_0)_1$, $(f_0)_2$ and $(f_0)_3$ of said first, said second and said third transducers at which each transducer has a maximum response, respectively, are different from each other.

9. A surface acoustic wave filter according to claim 1, in which each of said first, said second and said third transducers is divided parallel to said X-direction into two transducers connected in series.

10. A surface acoustic wave filter according to claim 1, in which at least one of said first, said second and said third transducers is apodized.

11. A surface acoustic wave filter according to claim 10, in which said first transducer is apodized in such a manner that energy of surface acoustic waves radiated from said first transducer is uniform along said Y-direction.

12. A surface acoustic wave filter according to claim 10, in which said second and said third transducers are apodized in such a manner that energy of surface acoustic waves radiated from said second and said third transducers are uniform along said Y-direction, and weighting functions of apodizing for said second and third transducers are symmetric with each other with respect to a center line of said first transducer.

13. A surface acoustic wave filter according to claim 1, in which each of said first transducer, said second transducer and said third transducer comprises two segmental transducers connected in parallel for one of said segmental transducers of each of said second and said third transducers to receive surface acoustic waves launched by one of said segmental transducers of said first transducer, and for the other of said segmental transducers of each of said second and said third transducers to receive surface acoustic waves launched by the other of said segmental transducers of said first transducer.

14. A surface acoustic wave filter according to claim 13, in which center frequencies of the two segmental transducers of each of said first, said second and said third transducers are identical to each other.

15. A surface acoustic wave filter according to claim 13, in which center frequencies of corresponding ones of said segmental transducers of said first, said second and said third transducers are identical to each other ($f_{11}$), and center frequencies of the other corresponding ones of said segmental transducers of said first, said second and said third transducers are identical to each other ($f_{12}$) but different from said $f_{11}$.

16. A surface acoustic wave filter according to claim 13, in which center frequencies of corresponding ones of said segmental transducers of said second and said third transducers are identical to each other ($f_{21}$), and center frequencies of the other corresponding ones of said segmental transducers of said second and said third transducers are identical to each other ($f_{22}$) but different from said ($f_{21}$).

17. A surface acoustic wave filter according to claim 13, in which the distance $l_1$ between the center lines of corresponding ones of said segmental transducers of said first and said second transducers is equal to the distance $l_2$ between the center lines of the corresponding ones of said segmental transducers of said first and said third transducers, and the distance $l_3$ between the center lines of the other corresponding ones of said segmental transducers of said first and said second transducers is equal to the distance $l_4$ between the center lines of the other corresponding ones of said segmental transducers of said first and said third transducers but is different from said $l_1$ or $l_2$.

18. A surface acoustic wave filter according to claim 13, in which at least one of said segmental transducers is apodized.

19. A surface acoustic wave filter according to claim 18, in which said segmental transducers of said first transducer $Tr_{12}$ are apodized with a similar weighting function.

20. A surface acoustic wave filter according to claim 13, in which the fingers of one of said segmental transducers of each of said first, said second and said third transducers are respectively connected to the other one of each of said first, said second and said third transducers.

21. A surface acoustic wave filter according to claim 20, in which at least one of said first, said second and said third transducers is apodized.

22. A surface acoustic wave filter according to claim 21, in which said first transducer is apodized.

23. A surface acoustic wave filter according to claim 1, in which inductors are connected in parallel to said source and said load for turning.

24. A surface acoustic wave filter according to claim 1, in which inductors are connected in series to said source and said load for tuning.

25. A surface acoustic wave filter according to claim 1, in which said second and said third transducers are connected in series.

26. A surface acoustic wave filter according to claim 1, in which said second and said third transducers are connected in parallel.

27. A surface acoustic wave filter according to claim 1, in which said second and said third transducers are connected to said signal source to launch surface acoustic waves, and said first transducer is connected to said load to connect said surface acoustic wave to electrical signals.

* * * * *